United States Patent [19]

Weir

[11] Patent Number: 4,595,847

[45] Date of Patent: Jun. 17, 1986

[54] BI-DIRECTIONAL HIGH VOLTAGE ANALOG SWITCH HAVING SOURCE TO SOURCE CONNECTED FIELD EFFECT TRANSISTORS

[75] Inventor: Basil Weir, San Jose, Calif.

[73] Assignee: Telmos, Inc., Sunnyvale, Calif.

[21] Appl. No.: 543,747

[22] Filed: Oct. 20, 1983

[51] Int. Cl.[4] .................. H03K 17/08; H03K 17/687; H03K 17/10; H03K 17/16
[52] U.S. Cl. ................................... 307/574; 307/584; 307/499; 307/501
[58] Field of Search ............... 307/240, 241, 242, 570, 307/571, 572, 577, 582, 583, 584, 498, 499, 501, 352, 353, 270, 574

[56] References Cited

U.S. PATENT DOCUMENTS

| 3,215,859 | 11/1965 | Sorchych | 307/577 |
| 3,510,684 | 5/1970 | Martin | 307/571 X |
| 3,521,141 | 7/1970 | Walton | 307/581 X |
| 3,532,899 | 10/1970 | Huth et al. | 307/572 |
| 4,311,930 | 1/1982 | Chan et al. | 307/583 X |
| 4,491,750 | 1/1985 | Janutka | 307/577 |
| 4,500,802 | 2/1985 | Janutka | 307/571 |

FOREIGN PATENT DOCUMENTS

| 143836 | 11/1980 | Japan | 307/584 |
| 192128 | 11/1982 | Japan | 307/583 |

Primary Examiner—Stanley D. Miller
Assistant Examiner—David R. Bertelson
Attorney, Agent, or Firm—Terrence E. Dooher; Alan H. MacPherson; Steven F. Caserza

[57] ABSTRACT

A high-voltage bi-directional analog switch is implemented using a pair of MOS depletion type transistors having their sources connected together and having their gates connected together. The drains constitute the high voltage input port and the high voltage output port. The switch conducts so long as the voltage on the common gate connection relative to the voltage on the common source connection is more positive that the pinch-off voltage. The source-to-gate voltages are controlled by a means including an enhancement mode transistor. Voltage level shift means are provided to shift low level logic signals to a sufficiently high level to control conductance through said enhancement mode transistor. The source of voltage rails need not provide two high voltages but at most only a single high voltage level is required.

7 Claims, 5 Drawing Figures

BI-DIRECTIONAL HIGH VOLTAGE ANALOG SWITCH HAVING SOURCE TO SOURCE CONNECTED FIELD EFFECT TRANSISTORS

This invention relates to a high voltage switch and more particularly to a high voltage switch which may in certain applications be implemented with low voltage power supplies.

BACKGROUND OF THE INVENTION

The purpose of an analog switch is to alternately pass or block a voltage signal which is allowed to vary with time, but for proper operation of the switch, the analog voltage must not range beyond a negative limit which we call $V_{min}$ and a positive limit which we call $V_{max}$. Examples of such allowable analog ranges might be (1) $V_{min} = -15$ V, $V_{max} = +15$ V; (2) $V_{min} = 0$ V, $V_{max} = +200$ V; or (3) $V_{min} = -100$ V, $V_{max} = -10$ V. In the case of the switched signal lying outside of the range for which the switch was designed the expectation is that the switch might malfunction or even be damaged.

A typical analog switch based on field effect technology is shown in FIG. 1. A complementary CMOS pair 14 consisting of transistors 15 and 16 is capable of switching signals having a range of $-15$ volts to $+15$ volts which are received on line 11. The switched signal is transmitted out on line 12. When a high actuating signal is applied to input line 13, inverter 10 transmits a signal to the gate of the p-channel enhancement transmitter 15 to render it conductive. Simultaneously, the switching signal is communicated to the gate of n-channel enhancement transistor 16 to render it conductive. Any analog signal impressed on line 11 is then passed through the complementary CMOS pair 14. When a low signal is introduced on line 13, the gate of n-channel transistor 16 is kept low so that no signal is transmitted. Similarly, the inverter 10 delivers a high signal to the gate of p-channel transistor 15, thereby rendering it nonconductive. This standard configuration is available as Intersil Part No. IH 5040 or as Analog Devices Part No. AD 7501. It is able to switch analog signals up to the limits of the rails of the power supplies, e.g., $-15$ V to $+15$ V, but cannot be used to control signals beyond the rails. In line with the limitations of analog gates based on field effect transistors, as described above, it is difficult to improve this standard analog switch for voltages much higher than several tens of volts because:

(1) the gate oxide is exposed to the full power supply voltage so that if the power supply range is increased to accommodate higher analog signal ranges, then the gate oxide must be grown inordinately thick;

(2) it is difficult to make the n-channel transistors with sufficiently high breakdown since they are fabricated in a p-well; and (3) the driving inverter 10 must be able to operate through the full analog range, and because of the inability to fabricate the n-channel transistors as described in item (2), this is difficult to achieve in a monolithic format.

High voltage analog switching has been previously accomplished by devices such as mechanical reed relays and optically coupled high voltage semiconductor circuits. Because of the problems described in the previous paragraph, high voltage analog switches have not generally been available as semiconductor components.

However, there exists an expanding requirement for high voltage analog switches in modern electronic equipment. In particular, it is desirable to extend the replacement of mechanical and electromechanical components by semiconductors to the high voltage domain. This would allow size, weight and power requirements to be further reduced. Applications for semiconductor-based high voltage analog switches include telecommunications equipment, test equipment and high voltage displays such as electroluminescent, vacuum fluorescent and plasma displays. For such applications, the switches would be required to withstand voltage differentials of up to 400 volts or more.

As described previously, the prior art circuits for high voltage switching have required, in general, the use of two power supplies to define the limits of the switch; these limits are typically called the "rails". Thus, to switch an analog signal which could vary in the range between $K_1$ volts and $K_2$ volts, where $K_2$ is more negative than $K_1$, e.g., where $K_1 = V_{max}$ and $K_2 = V_{min}$, one would need two power supplies. The first would generate $K_1$ volts and the second would produce $K_2$ volts. Thus for high voltage bi-directional switches, one would need in general two power supplies of high voltage rating. In the special case where either $K_1$ or $K_2$ is close to ground potential, then only one power supply of high voltage would be required. For example, if the voltage range were $-10$ volts to $+400$ volts, then one high voltage supply would be necessary to generate the voltage level of 400 volts. This requirement for power supplies of high rating adds to the cost and complexity of systems employing the conventional circuit configurations.

It is therefore an object of the present invention to provide a bi-directional high voltage switch which can be fabricated with semiconductor components.

It is another object of the present invention to provide a monolithic solid state bi-directional high voltage switch which can be made using conventional semiconductor technology.

It is an additional object of the present invention to provide a high voltage analog gate which requires its rail voltages to be set with respect to only the more negative limit of the analog voltage range as opposed to setting one rail with respect to the negative limit and the other rail with respect to the positive limit.

It is an additional object of the present invention to provide a high voltage switch which in the special case of the analog voltage limits being zero volts and a high positive voltage, neither of the rails need be of high voltage. In this case, one rail is a simple ground and the other rail requires a low voltage negative power supply.

It is a further object of the present invention to provide a high voltage analog switch which is implemented by using the inherent electrical properties of both enhancement and depletion transistors.

It is a further object of the present invention to provide a high voltage analog switch which is implemented using two types of high voltage transistors in addition to conventional CMOS. The first type of transistor is the vertical DMOS commonly known by a tradename "HEXFET". The other type of transistor is lateral conduction offset gate transistor. The above components are integrated into a monolithic circuit using the dielectric isolation technique.

BRIEF DESCRIPTION OF THE DRAWINGS

For a more complete understanding of the present invention, reference may be had to the accompanying drawings which are incorporated herein by reference and in which.

SUMMARY OF THE INVENTION

A high-voltage bi-directional analog switch is provided. At most, a single high voltage power supply is required to set the rails of the switch. In a special case, no high voltage power supply is required as the rails may be ground and a low voltage negative power supply. The analog switch is implemented using enhancement and depletion type transistors and conventional CMOS configurations which are integrated together with a DMOS transistor and a lateral conduction offset gate transistor.

The high voltage bi-directional analog switch comprises a level shifting means to shift a voltage level to a high level rail, depletion transistor means through which the analog voltage is passed and means to actuate and deactuate the depletion transistor means. In one embodiment, the source to gate capacitances of the depletion transistor means maintain a voltage on the gates. In order to deactuate the device, it is necessary to discharge these inherent capacitances.

It is desideratum to provide a high voltage analog gate which does not require the two rails to be set relative to the two extremes of the analog voltage range but rather allows both of the rails to be set with respect to the most negative limit of the analog voltage range. This is accomplished by utilizing high voltage n-channel transistors of the vertical conduction type and high voltage p-channel transistors of the offset gate type. Along with conventional low voltage CMOS these are integrated in a circuit of the dielectrically isolated type. The ability of the design to dispense with a rail which is referenced to the positive extreme of the analog range arises from the use of depletion type transistors as the switch elements. When these are "floated", as described subsequently, they are naturally "on" or conducting and need no external stimulus to their gate to induce conduction. Only when it is required that they block an impressed analog signal is a voltage applied to their gates with respect to their sources. The type of transistor used in this embodiment will block high voltages in only one direction, which is with the drain positive with respect to the source. For this reason two devices are used in series, with the drains towards the outside so that blocking is achieved regardless of the relative bias of the "analog in" and "analog out" terminals.

DESCRIPTION OF THE PREFERRED EMBODIMENT

Figure 2:
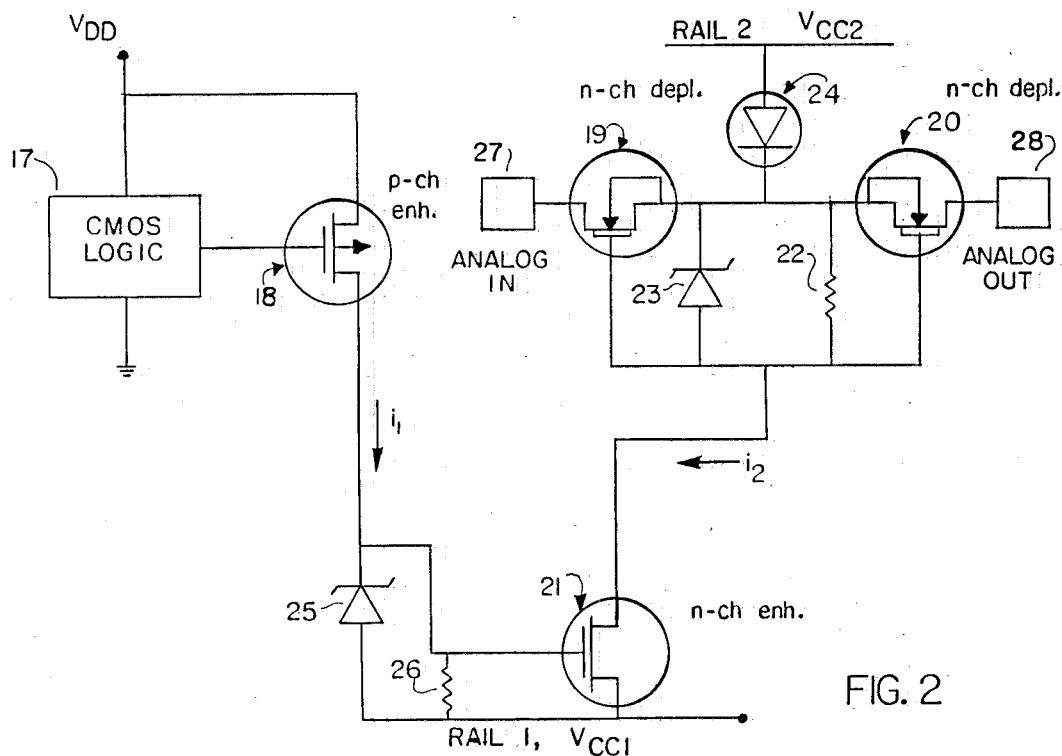
FIG. 2 is a circuit schematic of one embodiment of the bi-direction high voltage switch of the present invention.

The circuit schematic of one embodiment of the present invention is shown in detail in FIG. 2. The transistors and devices which are circled are high voltage devices, i.e. in the case of transistors they must be capable of sustaining high voltages in the off condition in the direction of conventional biasing for p-channel and n-channel transistors. The diode must be able to block high voltages in the nonconducting direction. These high voltages will be of the order of the highest voltage seen by the circuit, i.e., up to voltages of several hundred volts.

The drain of transistor 19, which is of the n-channel depletion type, serves as the analog input port 27. The drain of n-channel depletion transistor 20 serves as the analog output port 28. The sources of n-channel depletion transistors 19 and 20 are connected together. Switching is accomplished by turning transistors 19 and 20 on and off. The on and off states of these transistors will be determined by the voltages impressed on their respective gates relative to their sources. The two transistors are depletion transistors so they will conduct so long as the gate voltage relative to the source is not more negative than the pinch-off voltage. Otherwise, they conduct and in particular they conduct when the gate and source are at equal voltage which is the condition which exists in the circuit in the on condition of the analog switch.

The gate voltages of n-channel depletion transistors 19 and 20 are determined by the following ancillary circuitry which in effect is the actuation deactuation circuitry for the analog switch. The current $i_2$, controlled by the conduction characteristics of transistor 21 and the voltage difference between RAIL$_1$ ($V_{cc1}$) and RAIL$_2$ ($V_{cc2}$), flows through resistor 22 and causes a voltage drop across resistor 22 equal to its resistance times $i_2$. This voltage is impressed on the gates of transistors 19, 20 relative to their sources. In the case where $i_2$ is large, the voltage is of sufficient magnitude and in the proper sense to turn off n-channel depletion transistors 19, 20 by exceeding the pinch-off voltage. When $i_2$ is small or zero then there is no voltage generated across resistor 22 so that n-channel depletion transistors 19 and 20 are in their conducting mode. These two conditions of shut off and conduction for n-channel depletion transistors 19 and 20 control, respectively, the off and the on states of the analog switch. Should the magnitude of $i_2$ rise to such a degree that the voltage drop across resistor 22 exceeds the conduction voltage of zener diode 23, then the latter serves to clamp the voltage and protect the gates of transistors 19 and 20 from excessive bias.

For proper operation of the circuit, certain conditions on the rail voltages must be met. Suppose that the analog signals to be controlled have a range in which:

$V_{min}$ is the most negative extreme; and $V_{max}$ is the most positive extreme.

Then using inequalities in the algebraic sense one must meet the following conditions:

(1) For the "off" condition, $V_{cc2}$ must be greater than $V_{cc1}$ by some amount of the order of 10 volts.

(2) For the "on" condition $V_{cc2}$ must be less than $V_{min}$ or at most equal to it.

Note that for neither the "off" nor the "on" condition do the values for $V_{cc1}$ or $V_{cc2}$ relate to the value of $V_{max}$ but relate only to the conditions necessary to produce the "off" and "on" conditions for the switch. In operation, when transistor 21 is turned off and $i_2$ falls to essentially zero, the whole assembly of transistors 19 and 20, resistor 22 and zener diode 23 "floats", i.e., it takes on the instantaneous voltage of the analog input and adjusts with it as it varies with time since all of these elements are connected by the low impedance path of n-channel depletion transistors 19 and 20. Further, it will be observed that the condition of diode 24 is always reverse biased or at most has zero bias due to the relative values of $V_{cc2}$ and $V_{min}$ and therefore introduces essentially no current into the switch assembly consisting of transistors 19 and 20, resistor 22 and zener diode 23.

When transistor 21 turns on and starts to conduct current $i_2$ through the resistor 22, the bias voltage described previously develops in a very short time and causes transistors 19 and 20 to assume a very high impedance condition, thus isolating resistor 22 from the analog input and output lines. Current will continue to flow into transistor 21 and this will cause the voltage of resistor 21 and diode 23 to fall rapidly since the current is supplied only by the charge resident on the stray capacitance of transistors 19 and 21 (see subsequent discussion). The voltages of the sources and gates fall in the same way, while the drains of transistors 19 and 20 remain at whatever voltages are impressed externally at terminals 27 and 28. This presents no problem for these transistors since in the off state they can support large voltage differences between their sources and drain provided they are of the appropriate polarity. At a point when resistor 22 and zener diode 23 along with the sources and gates of transistors 19 and 20 fall to a level lower than $V_{cc2}$ then diode 24 will start to conduct due to its forward bias and supply the current $i_2$ which has all the while been flowing through transistor 21 since it began to conduct. This condition, with transistors 19 and 20 turned off, resistor 22 and zener diode 23 at a low voltage will persist so long as the current $i_2$ flows through transistor 21. When the current $i_2$ is flowing the stray capacitances shown in FIG. 3 charge up to the voltage level impressed across resistor 22.

Figure 3:
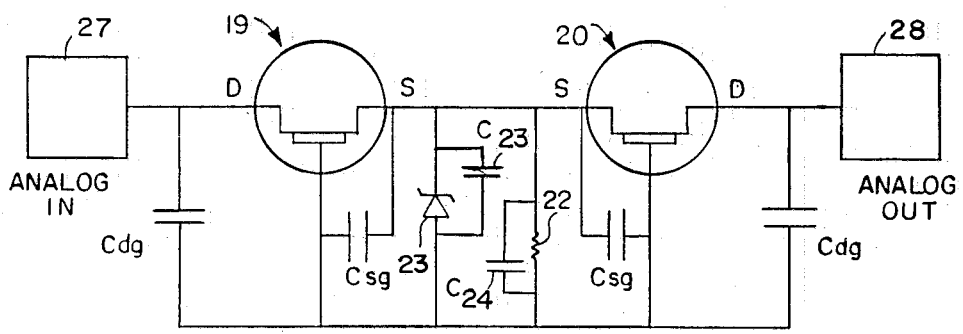
FIG. 3 is a circuit schematic of a portion of the circuit schematic of FIG. 2 which illustrates several built-in capacitances which are inevitable in the circuit of the present invention; these tend to degrade the speed performance and must be taken into account in any practicable design.

To turn the analog switch on, the current $i_2$ through transistor 21 is caused to decrease to a very low value or zero. At that time, the voltage across resistor 22 very rapidly falls to zero, the time depending on the speed with which the stray capacitances existing in transistors 19 and 20, in resistor 22 and in zener diode 23 can be discharged through resistor 22. These capacitances are shown in FIG. 3 as capacitance $C_{dg}$ (drain-to-gate) and $C_{sg}$ (source-to-gate) for transistors 19 and 20 and as capacitance $C_{23}$ for zener diode 23 and $C_{22}$ for resistor 22. To turn on the analog switch, the voltages associated with the collective capacitances must fall due to discharge through resistor 22 until the value is less than the pinch-off voltage. At this time, n-channel depletion transistors 19 and 20 assume their low impedance state and, as described above, transistors 19 and 20, resistor 22 and zener diode 23 assume as an essentially uniform voltage the voltage impressed at analog input terminal 27. Once more diode 24 will revert to its reverse biased, high impedance condition allowing only leakage current to pass and the switch assembly will "float" at the impressed analog voltage. The turn off occurs in a microsecond or less.

Figure 1:
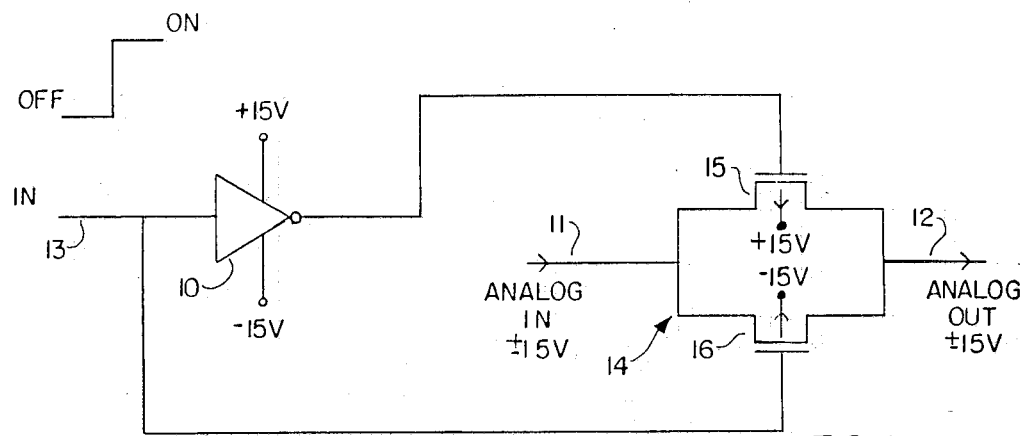
FIG. 1 is a simplified schematic diagram of a low-voltage analog switch of the prior art.
Figure 4:
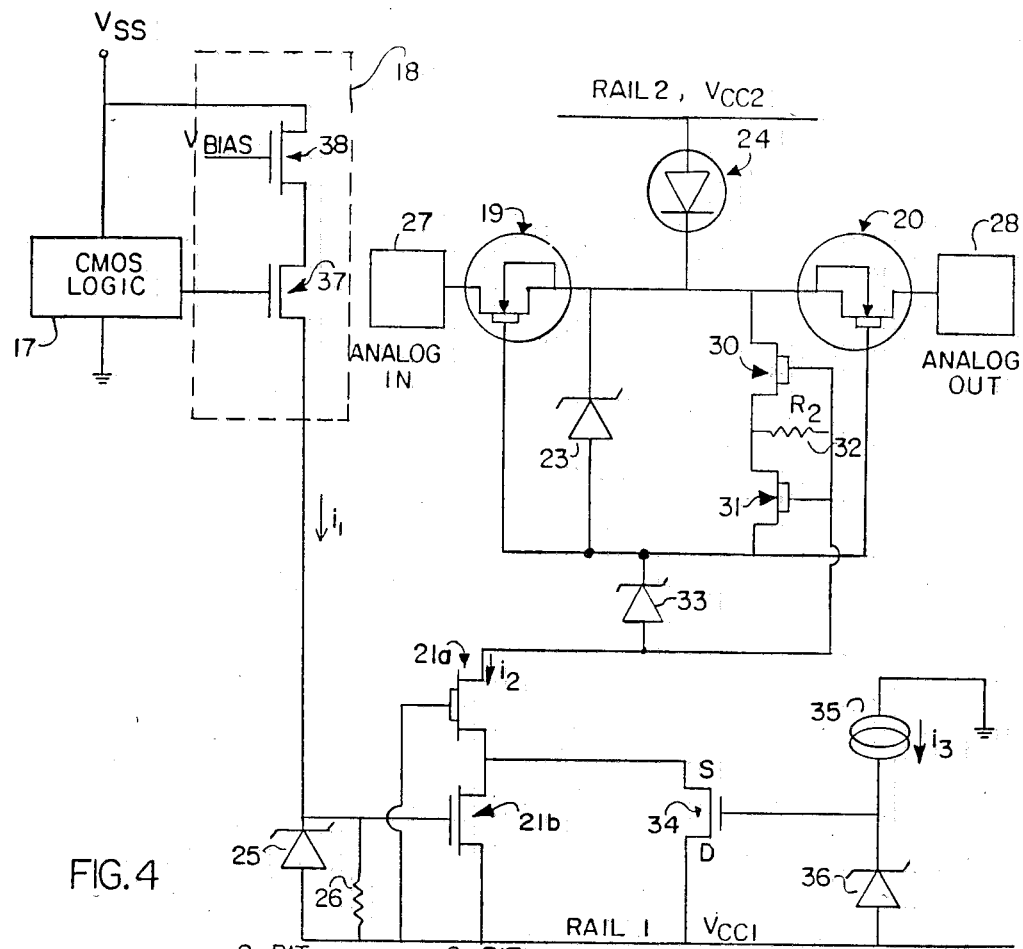
FIG. 4 is a circuit schematic of another embodiment of the bi-directional high-voltage switch of the present invention.

The current $i_2$ is the means by which the analog switch is turned on or off, as described above. The magnitude of $i_2$ is controlled in turn by controlling the current $i_1$ and thus altering the bias conditions on the gate of the high voltage n-channel enhancement transistor 21 in conjunction with the resistor 26 and zener diode 25. In turn the value of $i_1$ is controlled by the action of the low voltage CMOS logic circuitry 17 on the gate of p-channel enhancement transistor 18. In this fashion, the low voltage CMOS controls the analog switch which may connect or disconnect analog signals having a span of several hundred volts. The individual circuit components experience in normal operation various degrees of voltage stress depending on the values of $V_{max}$, $V_{min}$, $V_{cc1}$ and $V_{cc2}$. The ability of the circled high voltage components to withstand voltage stress must exceed the following conditions in algebraic terms:

(1) n-channel depletion transistors 19 and 20 must withstand $V_{max} - V_{min}$
(2) n-channel enhancement transistor 21 must withstand $V_{max} - V_{cc1}$
(3) p-channel enhancement transistor 18 must withstand $V_{cc1} - V_{dd}$
(4) diode 24 must withstand $V_{max} - V_{cc2}$ Another embodiment of the present invention is shown in FIG. 4. Where components are identical in type to those in the embodiment of FIG. 1, the same reference numerals are used. An analog signal is impressed on input terminal 27 and an analog output is available on output terminal 28. The state of the switch, i.e., whether transistors 19 and 20 conduct or are nonconductive, is controlled by the current $i_2$ as described for the embodiment of FIG. 1. The source-to-source interconnection of transistors 19 and 20 is retained. The embodiment of FIG. 4 shows a different means for producing the drain to source voltage for transistors 19 and 20, a different means to shift the CMOS voltage level provided by CMOS logic 17 to the high voltage level experienced in the transistor 21 and shows a different means for driving the gate of transistor 21 by the current $i_1$. These three differences are now discussed.

A resistive load is provided between the source and gate of transistor 19 and the source and gate of transistor 20 by means of transistors 30 and 31 which are connected in series. The drain of transistor 30 is connected to the common source connections of transistors 19 and 20. The source of transistor 31 is connected to the common gate connections of transistors 19 and 20. In addition, the gates of transistor 30 and 31 are connected together and to one side of diode 33 and to the drain of transistor 21. The other side of diode 33 is connected to the source of transistor 31. A resistor is tied between the source of transistor 30 and the common gate connection of the transistors 30 and 31. Transistors 30 and 31 and diode 33 comprise an effective resistance in lieu of resistor 22 of the embodiment of FIG. 2. This resistance has the preferred feature that it is not of constant value, but in fact varies in magnitude during the different phases of the transistions between conducting and nonconducting conditions of the analog switch. First, in the condition when $i_2$ is flowing in order to turn off the analog switch, depletion transistors 30, 31 are subjected to a negative bias on their gates relative to their sources and 30, 31 thus assume a high resistance state. This allows a rather small value of $i_2$ to be used by which to generate an adequate voltage to be developed across the above resistor (transistors 30, 31) by which to turn off transistors 19, 20. A small value of $i_2$ is desirable for reduction of power dissipation.

In the second transistion, where 19, 20 are reverting to a low impedance condition by the discharge of the stray capacitances, 30 and 31 assume their natural low impedance state, being depletion transistors, and the transition is concluded more swiftly.

The two transistors 37 and 38 together serve the function of transistor 18 shown in FIG. 2. The signal from CMOS logic 17 actuates the gate of transistor 37 while a bias voltage, $V_{bias}$, actuates the gate of transistor 38. Together the two transistors in series form what is called a cascode connection. A lateral p-channel transistor having the characteristics of the combined cascode connection of transistors 37 and 38 is disclosed in co-pending application of Basil Weir "High Voltage P-channel or N-channel Lateral Transistor" filed on even date herewith. The Cascode connection in conjunction with the initiation signal from CMOS logic 17 supplies the current $i_1$ which will produce the voltage to turn on the transistor 21b thereby allowing a current $i_2$ to flow through transistor 21. In this embodiment, transistor 21 is replaced by a high voltage depletion mode, n-channel transistor 21a and a low voltage enhancement mode transistor 21b. This effectively actuates or closes the switch. The function of Rail 1 ($V_{cc1}$), transistor 34, diode 36 and current source $i_3$ is as follows. During normal operation, the biasing action of current $i_3$ and diode 36 are such that enhancement p-channel transistor 34 is in a high impedance condition and so has no effect at all on circuit operation. The utility of transistor 34 occurs under abnormal conditions, for example, when the power supplies are accidentally turned off or fail. In the total absence of power, an external positive voltage entering from the signal source at 27 will find a low impedance exit at transistor 34 after passing through transistors 30, 31. The action of the current in 30, 31 will cause transistors 19 and 20 to assume a very high impedance condition, though not causing them to be absolutely off. This high impedance condition in a failure mode is generally better than the low impedance which 19 and 20 would assume were a low impedance path not available as provided by transistor 34.

Figure 5:
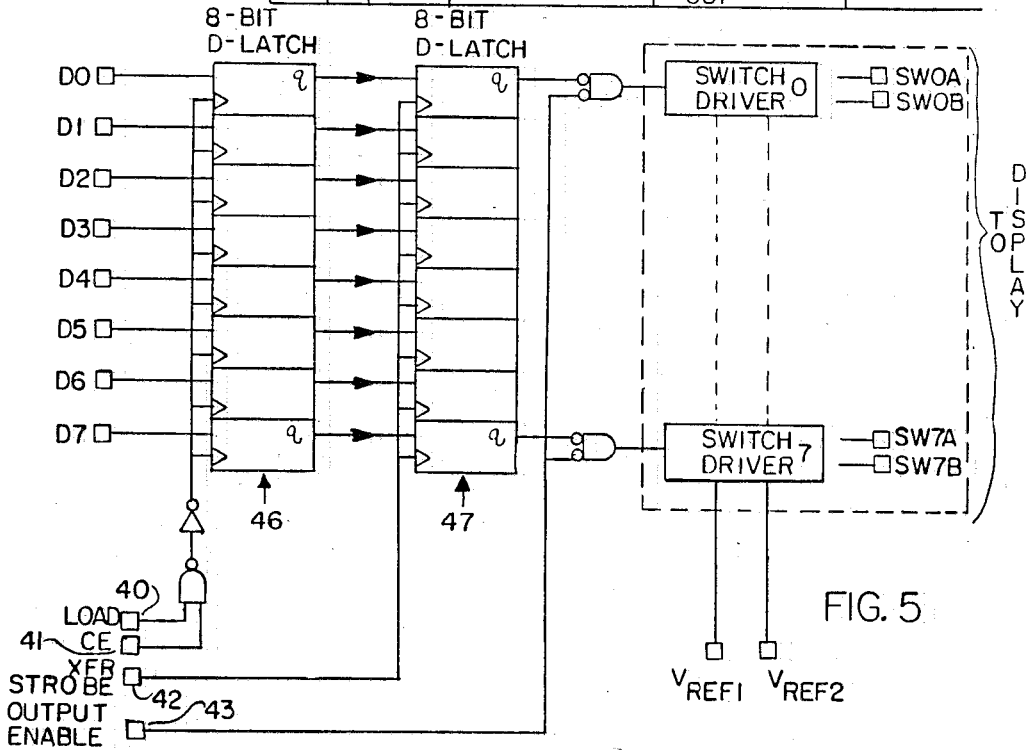
FIG. 5 is a diagram illustrating the bi-directional switch of the present invention as applied to switching the segments in an 8-bit alphanumeric display.

A typical application of the high voltage bidirectional switch of the present invention is illustrated in FIG. 5. A series of the switches is used on the inputs of the individual segments of an alphanumeric display. Such an alphanumeric display typically is configured with eight discrete segments in order to simulate all letters and numbers. Each segment necessarily is individually switched to permit the presentation of the complete range of numbers and letters. Signal information which determines the actuation for each of the eight bits is provided on the input terminals D0, D1, . . . D7. When a given letter or number is to be displayed, the 8-bit D-latch 46 is actuated by appropriate inputs on load terminal 40 and command enable terminal 41. Thus, the signal information will be loaded into the 8-bit D-latch 46. Then, upon an initiation signal impressed on XFR strobe input 42 the signals are transferred to 8-bit D-latch 47. Finally, the actuation signals as provided are transferred by a signal on output enable 43 to the associated switch drivers 0, 1, . . . 7. If an actuation signal appears on a given switch driver then the initiation logic level signal is supplied to the associated individual switch SW0A, SW0B, . . . SW7B which switches are the high voltage bi-directional switches of the present invention. When switched, the individual voltages are supplied to the associated segment of the alphanumeric display. This is akin to the initiation of the switch of FIGS. 2 and 4 by means of the CMOS logic block 17. Other applications for the high voltage bi-directional switch have been discussed in the Background of the Invention.

I claim:

1. A bi-directional high voltage switch comprising:
a pair of depletion mode MOS transistors having their sources connected together to form a common source and having their gates connected together to form a common gate and having their drain connections exposed externally to serve, respectively, as a high voltage analog input port and a high voltage analog output port, each of said depletion mode MOS transistors having the characteristic that it conducts so long as the voltage on its gate relative to the voltage on its source does not cause pinch off of said depletion mode MOS transistor;
a diode;
at least a first and a second voltage rail, said second voltage rail being connected to said common source through said diode; and
means for controlling said common gate-to-common source voltage of said pair of depletion mode MOS transistors, said means for controlling including
an enhancement mode transistor having a gate, a source and a drain, said drain being connected to said common gate of said pair of depletion mode MOS transistors, said source being connected to said first voltage rail,
a pair of MOS transistors having a source-to-drain connection, the external drain being connected to said common source of said pair of depletion mode transistors and the external source being connected to said common gate and further being connected through a diode to said drain of said enhancement mode transistor, the gates of said pair of MOS transistors being connected to said drain of said enhancement mode transistor.

2. A bi-directional high voltage switch in accordance with claim 1 in combination with a variable impedance network including a variable impedance connecting said drain of said enhancement mode transistor with said first voltage rail, said variable impedance providing a low impedance path when no power source is connected to said first voltage rail.

3. A bi-directional high voltage switch in accordance with claim 2 wherein said variable impedance comprises an additional transistor having its source connected to said drain of said enhancement mode transistor and having its drain connected to said first voltage rail, and wherein said variable impedance network further includes a current source connected through a diode to said first voltage rail, said current source also being connected to the gate of said additional transistor.

4. A bi-directional high voltage switch in accordance with claim 1 wherein said means for controlling further includes low level logic circuitry and voltage level shift means connected between said low level logic circuitry and said gate of said enhancement mode transistor, said low level logic circuitry providing an actuation information signal to said voltage level shift means, said voltage level shift means shifting the voltage level of said actuation information signal to a voltage level sufficient to control said enhancement mode transistor.

5. A bi-directional high voltage switch according to claim 4 wherein said voltage level shift means comprises two transistors connected in series, with the gate of one transistor connected to the low level logic circuitry and the gate of the other transistor for connecting to a bias voltage, the output signal of said series connected transistors being connected to the gate of said enhancement mode transistor.

6. A bi-directional high voltage switch in accordance with claim 4 wherein said voltage level shift means comprises a lateral p-channel transistor.

7. A bi-directional high voltage switch comprising:
a pair of depletion mode MOS transistors having their sources connected together to form a common source and having their gates connected together to form a common gate and having their drain connections exposed externally to serve, respectively, as a high voltage analog input port and a high voltage analog output port, each of said depletion mode MOS transistors having the characteristic that it conducts so long as the voltage on its gate relative to the voltage on its source does not cause pinch off of said depletion mode MOS transistor;
a diode;
at least a first and a second voltage rail, said second voltage rail being connected to said common source through said diode; and
means for controlling said common gate-to-common source voltage of said pair depletion mode MOS transistors, said means for controlling including
a depletion mode transistor having a gate, a source, and a drain, said gate of said depletion mode transistor being connected to said first voltage rail;
an enhancement mode transistor having a gate, a source and a drain, said drain of said enhancement mode transistor being connected to said source of said depletion mode transistor, said source of said enhancement mode transistor being connected to said first voltage rail,
a pair of MOS transistors having a source-to-drain connection, the external drain being connected to said common source of said pair of depletion mode MOS transistors and the external source being connected to said common gate and further being connected through a diode to said drain of said depletion mode transistor, the gates of said pair of MOS transistors being connected to said drain of said depletion mode transistor.

* * * * *